US009112091B2

(12) United States Patent
Mohammed et al.

(10) Patent No.: US 9,112,091 B2
(45) Date of Patent: Aug. 18, 2015

(54) APPARATUS AND METHOD FOR AN OPTICAL PACKAGE STRUCTURE USING ALUMINUM NITRIDE

(71) Applicant: FutureWei Technologies, Inc., Plano, TX (US)

(72) Inventors: Anwar A. Mohammed, San Jose, CA (US); Fei Yu, Santa Clara, CA (US); Qi Deng, San Jose, CA (US)

(73) Assignee: Futurewei Technologies, Inc., Plano, TX (US)

( * ) Notice: Subject to any disclaimer, the term of this patent is extended or adjusted under 35 U.S.C. 154(b) by 323 days.

(21) Appl. No.: 13/646,486

(22) Filed: Oct. 5, 2012

(65) Prior Publication Data
US 2014/0097333 A1 Apr. 10, 2014

(51) Int. Cl.
H01L 31/12 (2006.01)

(52) U.S. Cl.
CPC ........... H01L 31/12 (2013.01); Y10T 29/49139 (2015.01)

(58) Field of Classification Search
USPC ............ 250/216, 239, 208.1, 208.2; 359/819, 359/821, 811, 808; 385/92, 93
See application file for complete search history.

(56) References Cited

U.S. PATENT DOCUMENTS

| 5,200,249 | A | 4/1993 | Dolhert et al. | |
| 6,625,372 | B1 * | 9/2003 | Flanders et al. | 385/134 |
| 6,775,076 | B2 * | 8/2004 | Do et al. | 359/819 |
| 7,078,671 | B1 * | 7/2006 | Sherrer | 250/216 |
| 2004/0021217 | A1 | 2/2004 | Epitaux et al. | |
| 2005/0195877 | A1 * | 9/2005 | Koizumi et al. | 372/43.01 |

FOREIGN PATENT DOCUMENTS

| CN | 101582560 A | 11/2009 | |
| CN | 101728468 A | 6/2010 | |
| JP | 2000183479 A * | 6/2000 | ............... H05K 1/09 |

OTHER PUBLICATIONS

International Search Report received in Application No. PCT/CN2013/084240, mailed Jan. 9, 2014, 12 pages.

* cited by examiner

Primary Examiner — Francis M Legasse, Jr.
(74) Attorney, Agent, or Firm — Slater & Matsil, L.L.P.

(57) ABSTRACT

An apparatus and method are disclosed for providing monolithic optical packages. An embodiment optical package includes a base made of aluminum-nitride (AlN) that is configured to support an optical component, a plurality of sidewalls made of AlN that are coupled to the base, the sidewalls are configured to surround the optical component, and a feed-through made of AlN that is coupled to one of the sidewalls, wherein the feed-through is configured to feed a plurality of leads through the one sidewall to provide an electrical connection to the optical component, wherein the base, the sidewalls, and the feed-through have a same coefficient of thermal expansion (CTE) for AlN. An embodiment method includes punching and printing AlN tapes to build a base, a plurality of sidewalls joined to the base, and a feed-through coupled to the sidewalls, and attaching a plurality of electrical leads into the feed-through.

23 Claims, 2 Drawing Sheets

APPARATUS AND METHOD FOR AN OPTICAL PACKAGE STRUCTURE USING ALUMINUM NITRIDE

TECHNICAL FIELD

The present invention relates to optical packaging, and, in particular embodiments, to monolithic optical packages and methods using aluminum nitride.

BACKGROUND

Optical packages are used for different applications and technologies, such as for networking, automotives, digital cameras, camcorders, micro-electromechanical systems (MEMS), and other technologies. Examples of optical packages include housing packages for optical components (e.g., for optical communication systems), such as for housing diodes and/or photodetectors in optical transmitters/receivers. Optical packages are being increasingly used in such applications and technologies, but unlike other current technologies, present optical package technology has not had substantive modifications or improvements, such as in terms of lower cost and better performance. A new approach for optical packaging that improves performance and reduces cost is beneficial to the industry.

SUMMARY

In one embodiment, an optical package includes a base made of aluminum-nitride (AlN) and configured to support an optical component, a plurality of sidewalls made of AlN and coupled to the base, wherein the sidewalls are configured to surround the optical component, and a feed-through made of AlN and coupled to one of the sidewalls, wherein the feed-through is configured to feed a plurality of leads through the one sidewall to provide an electrical connection to the optical component, wherein the base, the sidewalls, and the feed-through have a same coefficient of thermal expansion (CTE) for AlN.

In another embodiment, a method for making a monolithic optical package includes punching and printing AlN tapes to build a base, a plurality of sidewalls joined to the base, and a feed-through coupled to the sidewalls, and attaching a plurality of electrical leads into the feed-through.

In yet another embodiment, an apparatus for an optical package includes a base, one or more sidewalls on the base that surround edges of the base, and a feed-through for conductive leads, the feed-through attached to the one or more sidewalls, wherein the base, the one or more sidewalls, and the feed-through are made from a single ceramic material providing a CTE match across the optical package

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Typically, optical packages are made from a combination of different materials and components (or parts) to reduce cost and possibly for manufacturing reasons (availability, supply, etc.). The different materials and components are selected according to mechanical, electrical, and other physical properties to ensure optical package performance and reliability. For instance, the materials for different parts are selected to manage a close coefficient of thermal expansion (CTE) match between the components. Maintaining a close CTE match helps to limit shape deformation of optical packages (e.g., caused by different rates of volume expansion for different materials due to heat), which can affect mechanical and/or alignment integrity. This can be critical in optical applications and other alignment sensitive applications, such as for optical laser systems and MEMS. The components of an optical package can also be selected based on other mechanical, electrical, or physical properties that improve performance and/or reduce cost.

Described herein are apparatus and method embodiments for optical packages that have better performance and lower cost. A monolithic optical package is built using substantially a single suitable material for all the parts or components, such as aluminum-nitride (AlN). Building a monolithic optical package using substantially a single material removes mismatch of physical properties between the components, such as CTE mismatch, which improves reliability and performance. AlN is used as a material for the monolithic optical package due to its relatively high CTE property, which improves performance. AlN also has lower cost than other materials used for optical packaging, and can be easily applied in manufacturing and combining different components into a monolithic optical package. Additionally, AlN has relatively high thermal conductivity, which is useful for integrating electrical connects in the optical package, relatively high porosity, which improves package plating, and relatively low dielectric loss, which improves speed performance. In some embodiments, the monolithic optical package may be built substantially using low-temperature co-fired ceramic (LTCC) or using a combination of AlN and LTCC.

Figure 1:
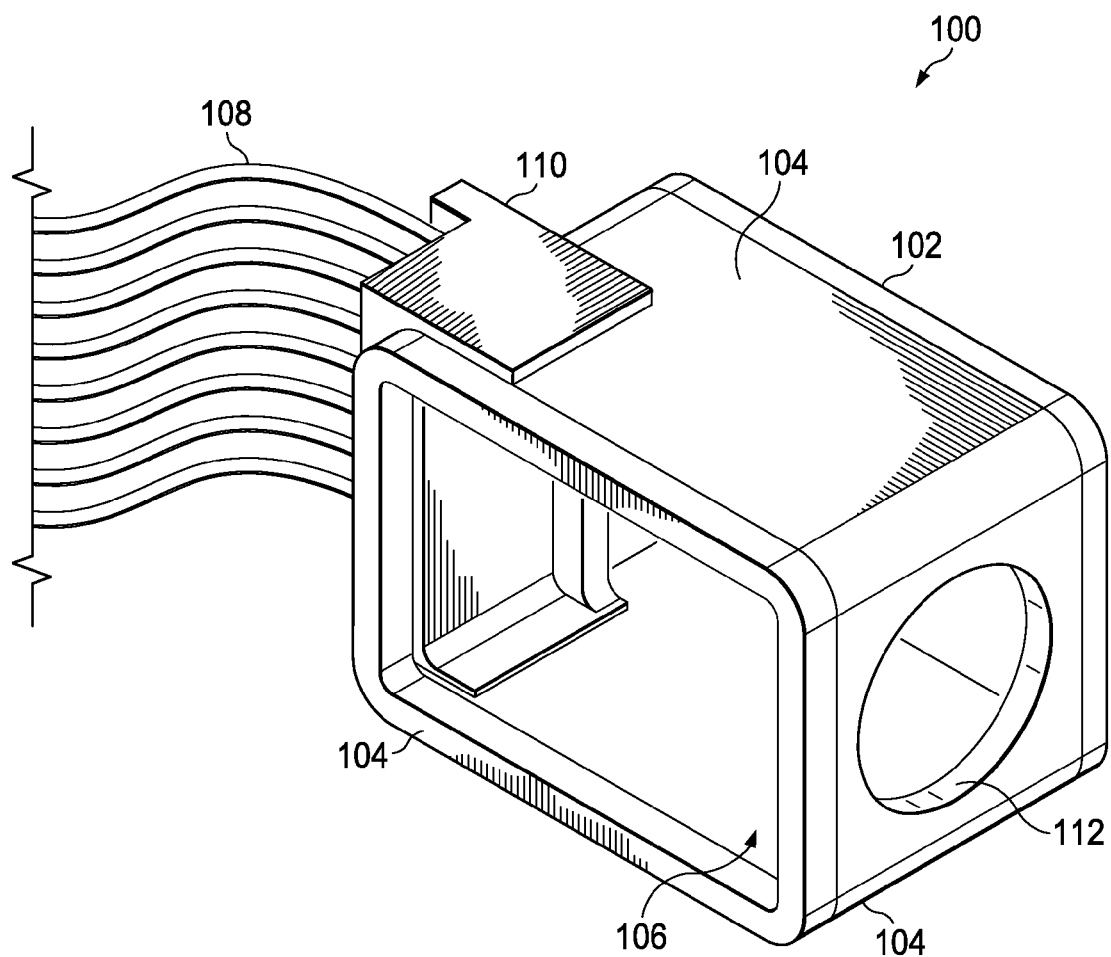
FIG. 1 illustrates an embodiment monolithic optical package.

FIG. 1 illustrates an embodiment of an optical package 100, i.e., a monolithic optical package that is built substantially using AlN. The optical package 100 is used to house an optical component such as a laser diode or a photo-detector (e.g., photodiode), such as for an optical transmitter/receiver. For example, the optical package 100 can be used as part of an optical communications system or other laser/fiber based systems. The optical package 100 is shown tilted or rested on one of its sides and comprises multiple parts, including a base 102, a plurality of sidewalls 104 that stand on the base 102 (coupled to the edges of the base 102), a top opening 106 that faces the base 102 on the opposite side of the sidewalls 104, and a plurality of leads 108 coupled to one of the sidewalls 104. The base 102 is used to support the optical component, the sidewalls 104 surrounds the optical component (e.g., for protection), and the leads 108 are conductive leads that provide external electrical connection to the optical component inside the optical package 100.

The leads 108 can be directly passed through the sidewall 104 to the optical component inside the optical package 100, or alternatively through a feed-through 110 that extends from one of the sidewalls 104 as a part of the optical package 100. The feed-through 110 provides coupling to the leads 108 and a feed through the sidewall 104 to the optical component. Additionally, the optical package 100 can include a lid (not shown) as a separate or removable part that covers or fits on the top opening 106. In some embodiments, one of the sidewalls 104, e.g., the sidewall 104 facing the leads 108, has an opening 112, such as a circular aperture, that allows a light beam to exit and/or enter the optical package 100 where the optical component (e.g., a diode or photo-detector) is housed. The aperture may be placed on the sidewall 104 opposite to the feed-through 110 and the leads 108. A lens and/or an optical filter can also be installed on the opening 112.

Although FIG. 1 shows a box-shaped optical package with a squared shaped base 102 and four sidewalls 104 with four corners, in other embodiments, the optical package 100 can have any suitable geometric shape for housing optical components. For example the base 102 can have more or less than four sides and accordingly the number of sidewalls 104 can be more or less than four. Alternatively, the base 102 can have a circular or elliptical shape and accordingly the optical package can have a cylindrical sidewall 104 that sits on the circular or elliptical base 102. The optical package 100 can also have any number of openings 112, of different suitable shapes, and any number of leads 108 on any suitable wall or side. The optical package 100 can also have two bases 102 on opposite sides of the sidewalls 104, e.g., without having a lid part. The optical package 100 can also house different optical and electrical components, including one or more light detectors, light sources, mirrors, lenses, optical filters, optical boards, circuit boards, MEMs, electric or electronic devices (e.g., chips), other suitable components, or combinations thereof.

Typically, the base of current optical packages that have similar functions or shapes to the optical package 100 is made of copper-tungsten (CuW), the sidewalls are made of Kovar, which is a nickel-cobalt alloy, the lid is also made of Kovar, and the feed-through is made of high-temperature co-fired ceramic (HTCC) alumina substrate. The different parts are typically joined to one another by brazing, which is a relatively costly high temperature process. Since each of the materials used for the different parts has a different CTE, this causes a mismatch in the CTE across the components and hence can cause deformation in the shape of the optical package in the case of heating at high temperatures, which reduces performance. For example, CuW has a CTE in the range from about 6 to 9 parts per million (PPM), Kovar has a CTE of about 6 PPM, and HTTC has a CTE in the range from about 7 to 9 PPM. CuW also has relatively high thermal conductivity, e.g., at about 180 Watts per meter-Kalvin (W/mK), which makes the base part made of CuW efficient for transferring or channeling heat, allowing for a more efficient heat sink. However, Kovar and HTCC have substantially lower thermal conductivity, e.g., at about 18 W/mK and about 16 W/mK respectively, which makes the sidewalls and feed made of such materials less suitable for dissipating heat. Further, Kovar and HTCC are materials engineered with lower CTE that matches ceramic and are relatively expensive.

To avoid CTE mismatch and further achieve high thermal conductivity (and hence better heat dissipation), the different components of the monolithic optical package 100, i.e., the base 102, the sidewalls 104, the feed 110 (if present), and the lid (not shown) are all composed of AN. This achieves a better and substantially complete CTE match between the parts and thus avoids or substantially limits shape deformation under heat. AlN has a CTE at about 4.5 PPM, which is lower than the typical materials used for optical packages and thus has more limited volume expansion under heat. AlN has also a relatively high thermal conductivity at about 200 W/mK, which is similar or close to that of CuW. Since substantially the entire optical package 100 is made of AlN, heat transfer and dissipation (e.g., via a heat sink) is improved in comparison to typical optical packages made from different materials, as described above. AlN also has lower dielectric loss than other materials typically used in optical packages. At high frequency applications (e.g., 15 Giga Hertz (GHz) or higher), the lower dielectric loss improves higher data rates transfer and hence enhances the speed performance.

The optical package 100 can be built using AlN green tapes, which are punched, printed, laminated, and then fired, e.g., at about 1,800° Celsius (C) to 2,000° C., to obtain a solid AlN ceramic. The AlN is fired in ambient reducing atmosphere (which is a mixture of nitrogen and hydrogen in the absence of oxygen). The leads 108 can be made of Kovar (a conductive material) and attached into the feed 110, for instance using gold-tin (AuSn) brazing, at a temperature of about 280° C.

Additional advantages of using AlN to build a monolithic optical package, such as the optical package 100, include the relatively reduced cost of AlN, its suitability for manufacturing, and its low porosity, e.g., compared to HTCC. For example, the overall cost of the optical package 100 is estimated to be at 20 percent lower than the cost of similar packages made using different materials, as described above. The low porosity of AlN allows for better plating (minimizing protrusions and dendrites) of the optical package 100, such as for providing protection to the parts or for esthetic purposes.

In another embodiment, a monolithic optical package, which may be similar to the optical package 100 or has a similar function of housing optical components, can be made substantially entirely of LTCC. The different components of the optical package (e.g., including a base, one or more sidewalls, and a feed) are made of LTCC to achieve a CTE match, for example a CTE of about 6 PPM. The monolithic optical package made of LTCC can be built using similar steps as the optical package 100 made of AN. However, LTCC can be shaped and fired at about 850° C. in normal atmosphere with oxygen. Since LTCC has lower thermal conductivity than AlN, a LTCC based monolithic optical package has less heat dissipation efficiency than an AlN based monolithic optical package. In yet another embodiment, a combination of AlN and LTCC can be used to build an optical package, where different parts can be made of AlN or LTCC.

Figure 2:
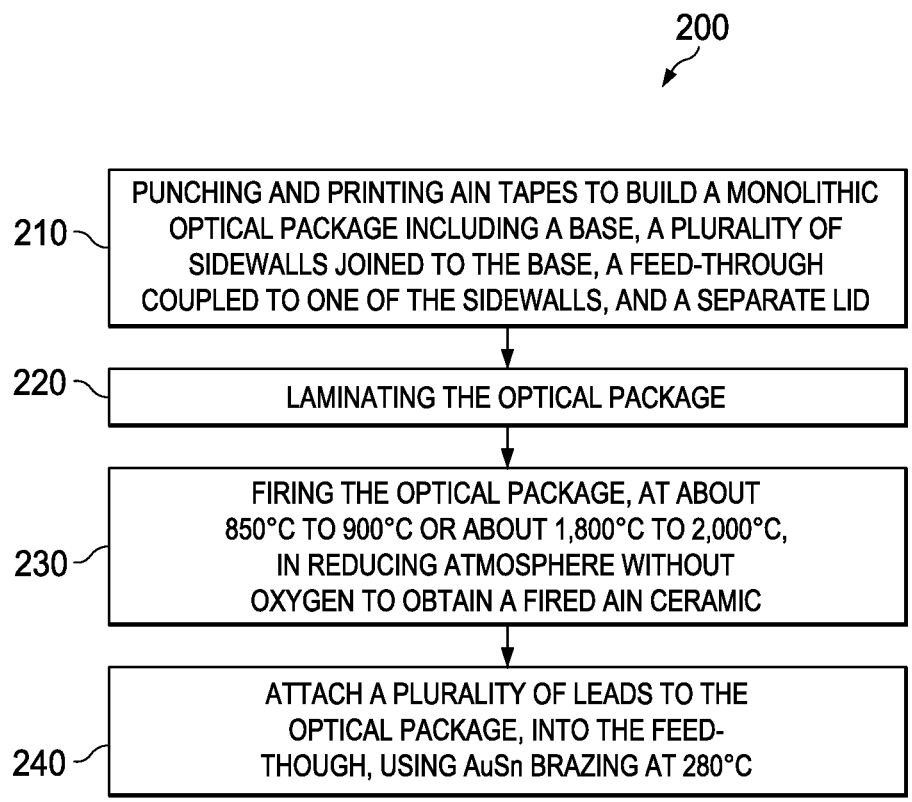
FIG. 2 illustrates an embodiment method for building a monolithic optical package.

FIG. 2 illustrates an embodiment method 200 for building a monolithic optical package, such as the optical package 100. At step 210, the method 200 includes punching and printing AlN tapes to build a monolithic optical package including a base, a plurality of sidewalls joined to the base, a feed coupled to one of the sidewalls, and a separate lid. One of the sidewalls can also be punched to create an aperture in the sidewall. At step 220, the optical package is laminated. At step 230, the optical package is fired, e.g., at about 850° C. to 900° C. or about 1,800° C. to 2,000° C., in reducing atmosphere without oxygen to obtain an AlN ceramic. At step 240, a plurality of leads are attached to the optical package (into the feed), e.g., using AuSn brazing at 280° C.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An optical package comprising:
    a base made of aluminum-nitride (AlN), the base having a plurality of edges and configured to support an optical component;
    a plurality of sidewalls made of AlN joined together and standing around the plurality of edges of the base, wherein the sidewalls are configured to surround the optical component on the base and form a first opening opposite to the base; and
    a feed-through made of AlN and coupled to a first sidewall of the sidewalls standing on the base, wherein the feed-through is configured to feed a plurality of electrical leads through the first sidewall to provide an electrical connection to the optical component, and wherein a second sidewall of the sidewalls includes a second opening facing the feed-through,
    wherein the base, the sidewalls, and the feed-through have a same coefficient of thermal expansion (CTE) for AlN.

2. The optical package of claim 1, wherein the base, the sidewalls, and the feed-through have a CTE of about 4.5 parts per million (PPM).

3. The optical package of claim 1, wherein the base, the sidewalls, and the feed-through made of AlN have a thermal conductivity of about 200 Watts per meter-Kelvin (W/mK).

4. The optical package of claim 1, wherein the base, the sidewalls, and the feed-through are made of an AlN fired ceramic.

5. The optical package of claim 1, wherein the electrical leads are made of Kovar.

6. The optical package of claim 1, wherein AlN has lower porosity that improves plating of the base, the sidewalls, and the feed-through in comparison to high or low temperature co-fired ceramic.

7. The optical package of claim 1, wherein AlN has lower dielectric loss that improves speed performance in comparison to high or low temperature co-fired ceramic.

8. The optical package of claim 1 further comprising a removable lid made of AlN and configured to cover the first opening opposite to the base.

9. The optical package of claim 1 further comprising an aperture placed on another one of the sidewalls opposite to the first sidewall coupled to the feed-through.

10. The optical package of claim 1, wherein the optical component comprises a light source, a light detector, or both.

11. A method for making a monolithic optical package, the method comprising:
    punching and printing aluminum-nitride (AlN) tapes to form a base having a plurality of edges, a plurality of sidewalls joined together and standing around the plurality of edges of the base, a feed-through coupled to the sidewalls standing on the base, and a first opening surrounded by edges of the sidewalls opposite to the base;
    forming in one of the sidewalls a second opening facing the feed-through; and
    attaching a plurality of electrical leads into the feed-through.

12. The method of claim 11 further comprising laminating the base, the sidewalls, and the feed-through.

13. The method of claim 11 further comprising building a separate lid for the optical package using the AlN tapes.

14. The method of claim 11 further comprising firing the base, the sidewalls, and the feed-through to obtain an AlN ceramic.

15. The method of claim 14, wherein the base, the sidewalls, and the feed-through are fired at about 850° C. to 900° C. in a reducing atmosphere without oxygen.

16. The method of claim 11, wherein the base, the sidewalls, and the feed-through are fired at about 1,800° C. to about 2,000° C.

17. The method of claim 11, wherein the electrical leads are attached into the feed-through using gold-tin (AuSn) brazing at about 280° C.

18. An apparatus for an optical package comprising:
    a base having a plurality of edges;
    one or more sidewalls joined together and standing around the plurality of edges of the base, wherein the sidewalls form a first opening opposite to the base; and
    a feed-through for conductive leads, the feed-through attached to the one or more sidewalls standing on the base, wherein one of the sidewalls includes a second opening facing the feed-through,
    wherein the base, the one or more sidewalls, and the feed-through are made from a single ceramic material providing a coefficient of thermal expansion (CTE) match across the optical package.

19. The apparatus of claim 18, wherein the single ceramic material is high-temperature, reducing atmosphere-fired aluminum nitride (AlN).

20. The apparatus of claim 18, wherein the single ceramic material is normal atmosphere, low-temperature co-fired ceramic (LTCC).

21. The optical package of claim 1, wherein the sidewalls include a first sidewall positioned behind the optical component and a second sidewall positioned in front of the optical component.

22. The optical package of claim 1, wherein the opening in the one of the sidewalls facing the feed-through is a circular aperture.

23. The optical package of claim 1, wherein the sidewalls and the base form a box shaped package.

* * * * *